(12) United States Patent
Tanizaki

(10) Patent No.: US 7,032,141 B2
(45) Date of Patent: Apr. 18, 2006

(54) SEMICONDUCTOR DEVICE INCLUDING TEST-FACILITATING CIRCUIT USING BUILT-IN SELF TEST CIRCUIT

(75) Inventor: Tetsushi Tanizaki, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 423 days.

(21) Appl. No.: 10/198,106

(22) Filed: Jul. 19, 2002

(65) Prior Publication Data

US 2003/0145261 A1    Jul. 31, 2003

(30) Foreign Application Priority Data

Jan. 25, 2002 (JP) .............................. 2002-017390

(51) Int. Cl.
*G11C 29/00* (2006.01)

(52) U.S. Cl. ..................... 714/718; 714/730; 714/738

(58) Field of Classification Search .................. 714/29, 714/48, 52, 53, 703, 715, 718, 730, 733, 714/738, 724, 734, 736

See application file for complete search history.

(56) References Cited

U.S. PATENT DOCUMENTS

| | | | | |
|---|---|---|---|---|
| 5,337,318 | A * | 8/1994 | Tsukakoshi et al. | 714/708 |
| 5,675,545 | A * | 10/1997 | Madhavan et al. | 365/201 |
| 5,809,038 | A * | 9/1998 | Martin | 714/719 |
| 6,243,307 | B1 | 6/2001 | Kawagoe | |
| 6,658,611 | B1 * | 12/2003 | Jun | 714/719 |
| 6,687,866 | B1 * | 2/2004 | Fukuda | 714/733 |
| 6,782,498 | B1 * | 8/2004 | Tanizaki et al. | 714/733 |
| 6,865,701 | B1 * | 3/2005 | Youngs et al. | 714/718 |

FOREIGN PATENT DOCUMENTS

| | | |
|---|---|---|
| JP | 8-255500 | 10/1996 |
| JP | 11-213700 | 8/1999 |
| JP | 2001-148199 | 5/2001 |
| JP | 2001-167600 | 6/2001 |

OTHER PUBLICATIONS

Masaru Haraguchi, et al, "A Semiconductor Test Circuit for Testing a Semiconductor Memory Device Having a Write Mask Function" U.S. Appl. No. 10/122,365, Filed Apr. 16, 2002.

Tetsushi Tanizaki, et al "Semiconductor Memory Device With Built-in-Self Test Circuit Operating at High Rate" U.S. Appl. No. 09/712,246, Filed Nov. 15, 2000.

* cited by examiner

*Primary Examiner*—Albert Decady
*Assistant Examiner*—Fritz Alphonse
(74) *Attorney, Agent, or Firm*—McDermott Will & Emery LLP

(57) ABSTRACT

A test interface circuit, which has a simple pattern generator mounted on a semiconductor device having a mounted memory, consists of a command analysis section which analyses a command of three bits received from a tester, outputs an analysis result to a memory core and controls an operation of the memory core, and an address counter which counts addresses and outputs the addresses to the memory core in accordance with a counter control instruction of two bits received from the tester. It is, therefore, possible to make a circuit for testing the memory core small in scale and to decrease the number of pins for testing the memory core, so that it is possible to use an inexpensive tester and to reduce cost required to test the memory core.

7 Claims, 12 Drawing Sheets

FIG.6A

| COMMAND TABLE | |
|---|---|
| 3'b000 "NOP" | X-ADD IS SELECTED FOR COUNTER OPERATION |
| 3'b001 "ACT" | |
| 3'b010 "PRC" | |
| 3'b011 "PRCA" | |
| 3'b100 "REFA" | |
| 3'b101 "WT" | Y-ADD IS SELECTED FOR COUNTER OPERATION |
| 3'b110 "RD" | |

FIG.6B

| COUNTER CONTROL INSTRUCTION | OPERATION OF SELECTED COUNTER |
|---|---|
| 2'b00 "NOP" | HOLD PREVIOUS VALUE |
| 2'b01 "INC" | INCREMENT +1 |
| 2'b10 "DEC" | DECREMENT −1 |

| CLOCK | COMMAND | COUNTER CONTROL INSTRUCTION | (COUNTER OPERATION FOR ADDRESS) |
|---|---|---|---|
| n | ACT | NOP | (X-ADD HOLDS PREVIOUS VALUE) |
| n+1 | WT(RD) | INC | (Y-ADD INCREMENTS +1) |
| n+2 | PRC | INC | (X-ADD INCREMENTS +1) |
| n+3 | ACT | NOP | (X-ADD HOLDS PREVIOUS VALUE) |
| n+4 | WT(RD) | INC | (Y-ADD INCREMENTS +1) |
| n+5 | PRC | INC | (X-ADD INCREMENTS +1) |

SEMICONDUCTOR DEVICE INCLUDING TEST-FACILITATING CIRCUIT USING BUILT-IN SELF TEST CIRCUIT

BACKGROUND OF THE INVENTION

1. Field of the Invention

The present invention relates to a test-facilitating circuit in a semiconductor device, and more particularly relates to a test-facilitating circuit which uses a built-in self test (referred to as "BIST" hereinafter) circuit.

2. Description of the Background Art

Recently, the development of semiconductor devices having mounted memories is actively underway. Typically, since the number of data lines is large and no control signal and no data signal are directly outputted to the external pin of a semiconductor device, a memory core mounted on the semiconductor device is provided with a test interface circuit (referred to as "TIC" hereinafter) for testing the memory core. In a test state, an ATE (Auto Test Equipment) accesses the memory core through the TIC and the memory is thereby tested.

FIG. 1 is a block diagram showing one example of a semiconductor device having a mounted memory having a memory core including a conventional TIC mounted thereon. A semiconductor device having a mounted memory 101 includes a memory core 103, a logic circuit 104 which controls memory core 103, a TIC 105, a selector 106 which receives an output signal from an ATE 102 and outputs the output signal to one of logic circuit 104 and TIC 105, and which receives output signals from logic circuit 104 and TIC 105, respectively and selectively outputs one of the output signals to ATE 102, and a selector 107 which receives output signals from logic circuit 104 and TIC 105, respectively and selectively outputs one of the output signals to memory core 103.

Since an input/output pin dedicated to testing memory core 103 is not provided outside of semiconductor device having a mounted memory 101, ATE 102 switches over selectors 106 and 107 in response to an MTEST signal and performs a test to memory core 103.

However, even if this TIC is mounted on a semiconductor device, the cost of the semiconductor device is disadvantageously pushed up because of a large number of pins required for the test, a small number of times of measurement for the test, need to use an expensive ATE and the like. Various types of test-facilitating methods have been developed as techniques for solving this disadvantage. Among them, a BIST technique has been particularly introduced to logic circuit loading memories.

Nevertheless, since logic circuit loading memories differ from one another in memory specifications such as the data configuration of a memory core mounted thereon, read latency and data capacity, it is necessary to reconstruct a BIST circuit for each semiconductor device. Since logic circuit loading memories are customized to respective systems, the production volume of logic circuit loading memories differ according to the systems. While it is demanded to develop semiconductor devices in short time, it has been disadvantageously difficult to mount a BIST circuit corresponding to memory cores of various specifications on a semiconductor device.

SUMMARY OF THE INVENTION

It is an object of the present invention to provide a test-facilitating circuit capable of reducing cost required to test a semiconductor device.

It is another object of the present invention to provide a test-facilitating circuit corresponding to semiconductor devices of various specifications.

According to one aspect of the present invention, a test-facilitating circuit mounted on a memory device to test the memory device, includes: a memory core; and a first test circuit testing the memory core, wherein the first test circuit includes: a data generation circuit generating data written to the memory core; a data determination circuit determining the data read from the memory core; a command analysis section analyzing an externally applied command, outputting an analysis result to the memory core, and controlling an operation of the memory core; and an address counter counting addresses and outputting the addresses to the memory core in accordance with an externally applied counter control instruction.

It is, therefore, possible to make a circuit used to test the memory core small in scale and to decrease the number of pins used to test the memory core, so that it is possible to use an inexpensive tester and to reduce cost required to test the memory core.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 6A and 6B are explanatory views for contents of commands and counter control instructions outputted from an ATE 2;

DESCRIPTION OF THE PREFERRED EMBODIMENTS (First Embodiment)

Figure 1:
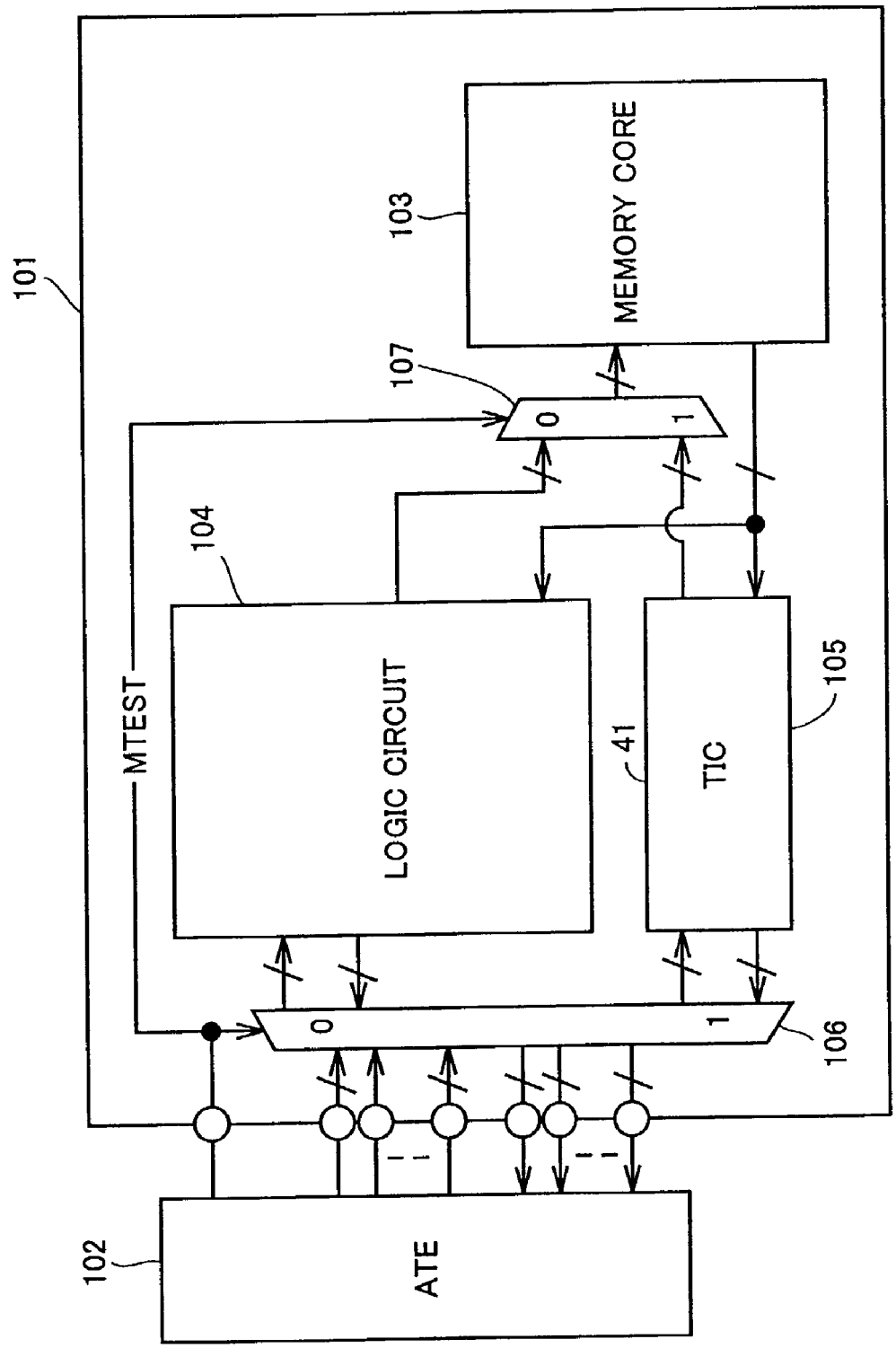
FIG. 1 is a block diagram showing one example of a semiconductor device having a mounted memory on which a conventional TIC of a memory core is mounted.
Figure 2:
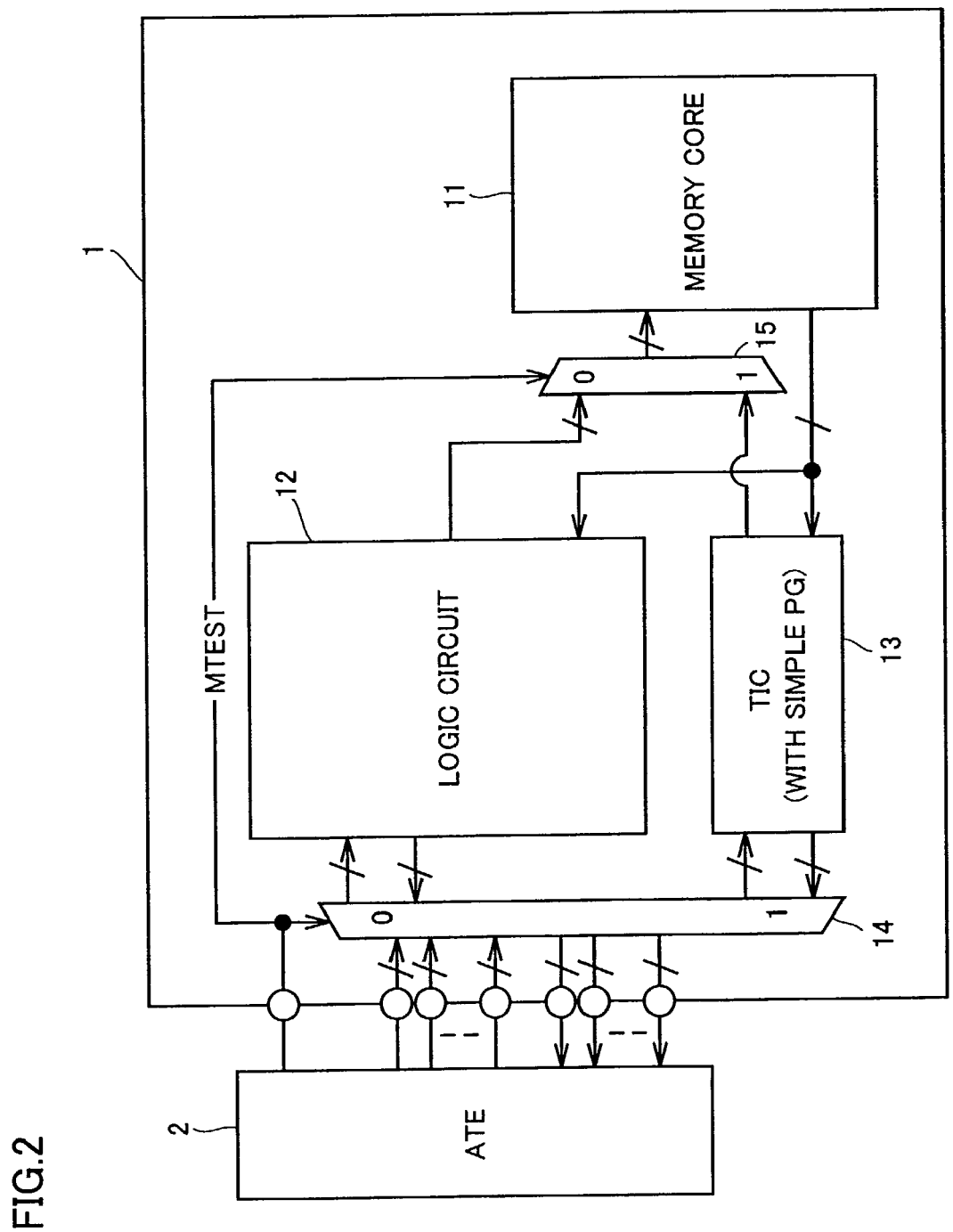
FIG. 2 is a block diagram showing a schematic configuration of a semiconductor device having a mounted memory on which a test-facilitating circuit according to a first embodiment of the present invention is mounted.

FIG. 2 is a block diagram showing the schematic configuration of a semiconductor device having a mounted memory on which a test-facilitating circuit in the first embodiment according to the present invention is mounted. This semiconductor device having a mounted memory 1 includes a memory core 11, a logic circuit 12 which controls memory core 11, a TIC having a simple PG (Pattern Generator) (simply referred to as "TIC" hereinafter) 13, a selector 14 which receives an output signal from ATE 2 and outputs the output signal to one of logic circuit 12 and TIC 13 and which receives output signals from logic circuit 12 and TIC 13, respectively and selectively outputs one of the output signals to ATE 2, and a selector 15 which receives the output signals from logic circuit 12 and TIC 13, respectively and selectively outputs one of the output signals to memory core 11.

In a normal operation, ATE 2 sets an MTEST signal at low level to allow the output signal from ATE 2 to be outputted to logic circuit 12 and the output signal from logic circuit 12 to be outputted to ATE 2 or memory core 11.

In a test operation, ATE 2 sets MTEST signal at high level to allow the output signal from ATE 2 to be outputted to TIC 13 and the output signal from TIC 13 to be outputted to ATE 2 or memory core 11.

TIC 13 is constituted so that simple PG is added to a data generation/determination circuit in a semiconductor test circuit. Firstly, the data generation/determination circuit of the semiconductor test circuit will be briefly described.

Figure 3:
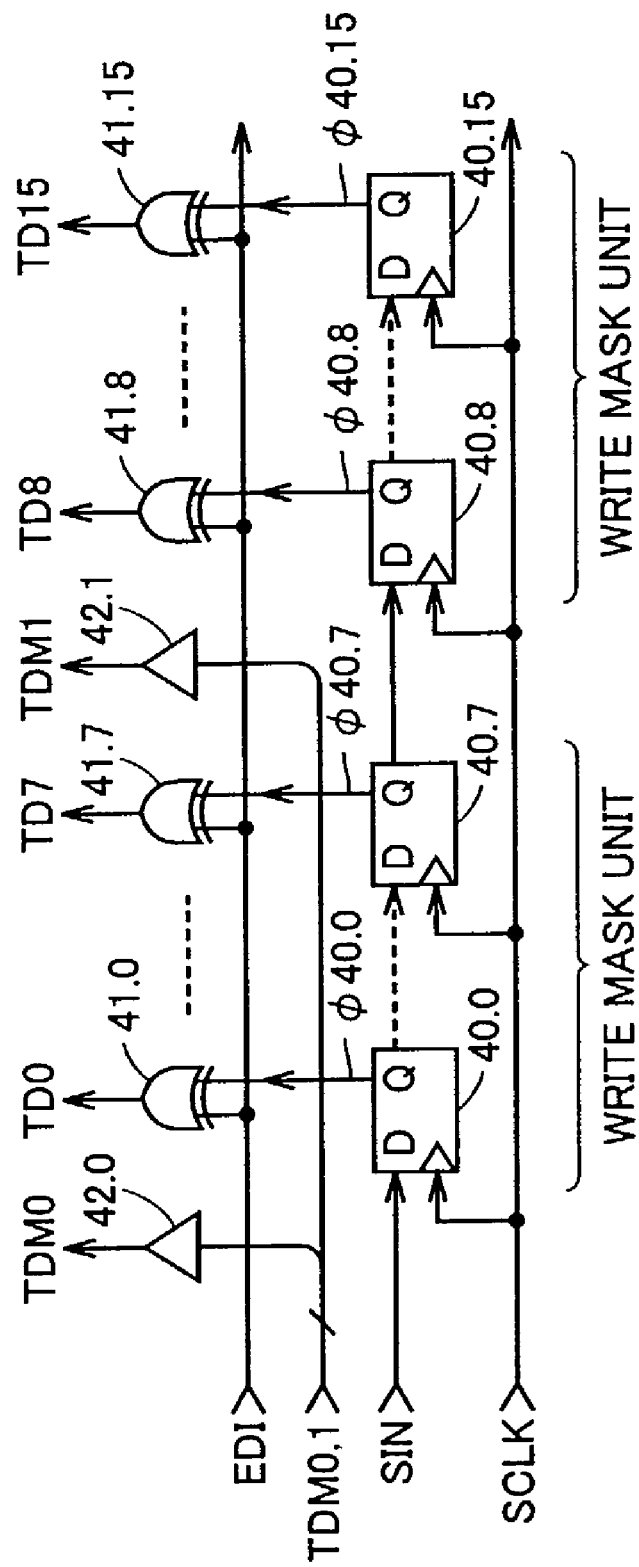
FIG. 3 is an explanatory view for a circuit which generates data in a data generation/determination circuit.

FIG. 3 is a view for explaining a circuit which generates data in the data generation/determination circuit. This data generation/determination circuit includes data independent registers 40.0 to 40.15, EX-OR gates 41.0 to 41.15 and buffers 42.0 and 42.1.

By changing the level of a data signal SIN synchronously with a clock signal SCLK, it is possible to store data signals at desired logic levels in registers 40.0 to 40.15, respectively.

One of the input nodes of EX-OR gates 41.0 to 41.15 receive external write data signal EDI, and another input nodes thereof receive output signals ø40.0 to ø40.15 of registers 40.0 to 40.15, respectively. The output signals of EX-OR gates 41.0 to 41.15 become test write data signals TD0 to TD15, respectively.

Clock signal SCLK, data signal SIN and write mask signals TDM0 and TDM1 of the data generation/determination circuit shown in FIG. 3 are generated in the data generation/determination circuit in response to an external control signal inputted from ATE2 through selector 14. In addition, write mask signals TDM0 and TDM1 and write data signals TD0 to TD 15 are outputted to memory core 11 through selector 15 shown in FIG. 2. Further, external write data signal EDI is inputted from ATE 2 through selector 14 shown in FIG. 2.

Figure 4:
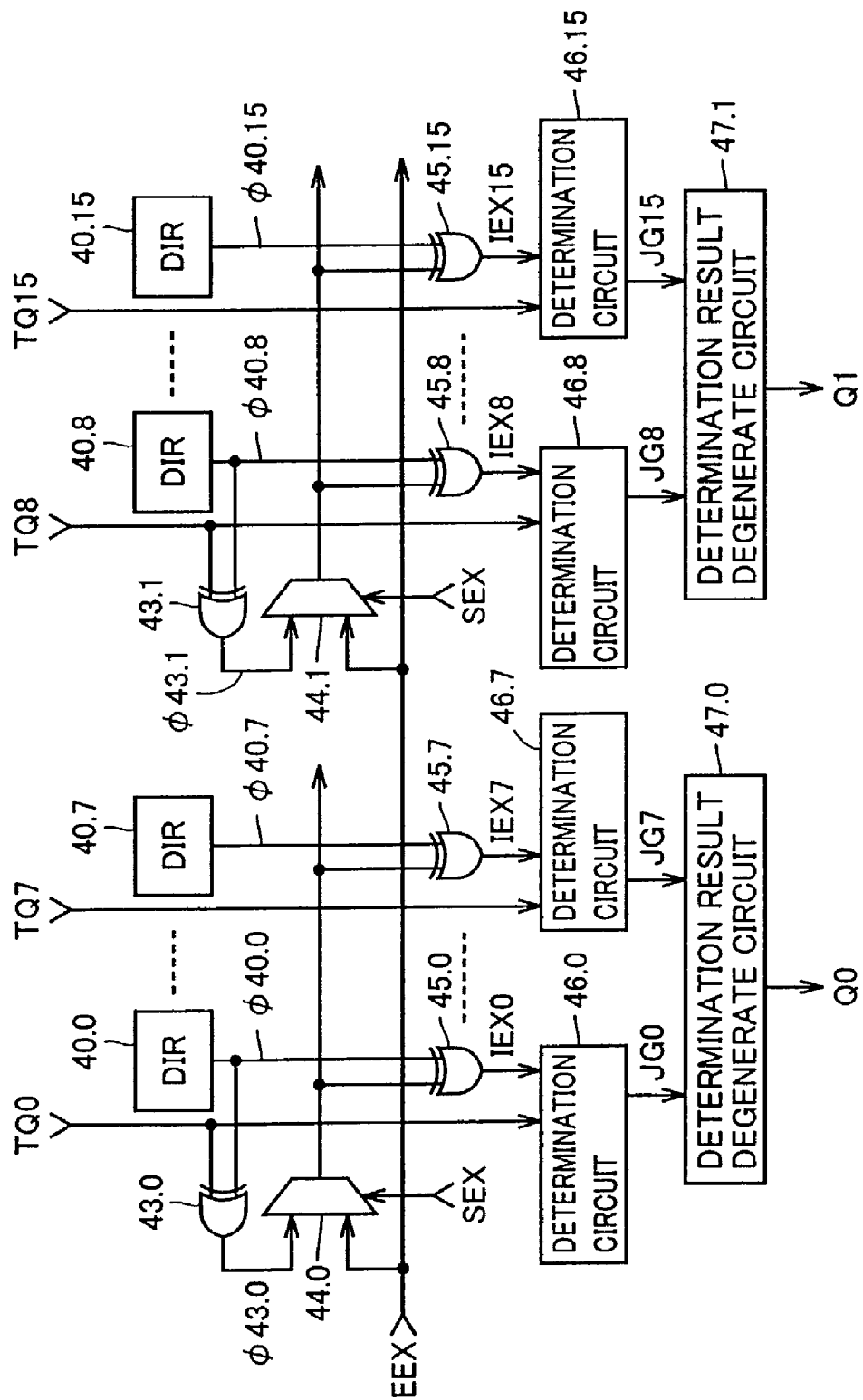
FIG. 4 is an explanatory view for a circuit which determines data in the data generation/determination circuit.

FIG. 4 is a view for explaining a circuit which determines data in the data generation/determination circuit. This data generation/determination circuit includes EX-OR gates 43.0, 43.1 and 45.0 to 45.15, selectors 44.0 and 44.1, determination circuits 46.0 to 46.15, and determination result degenerate circuits 47.0 and 47.1.

EX-OR gate 43.0 receives a data signal TQ0 and the output signal ø40.0 of register 40.0. Selector 44.0 receives the output signal of EX-OR gate 43.0 and an external expected value EEX. If a signal SEX is at "L" level, selector 44.0 applies external expected value EEX to one of the input nodes of each of EX-OR gates 45.0 to 45.7 and if a signal S0 is at "H" level, selector 44.0 applies the output signal of EX-OR gate 43.0 to one of the input nodes of each of EX-OR gates 45.0 to 45.7.

EX-OR gate 43.1 receives a data signal TQ8 and the output signal ø40.8 of register 40.8. Selector 44.1 receives the output signal of EX-OR gate 43.1 and external expected value EEX. If signal SEX is at "L" level, selector 44.1 applies external expected value EEX to one of the input nodes of each of EX-OR gates 45.8 to 45.15 and if a signal S1 is at "H" level, selector 44.1 applies the output signal of EX-OR gate 43.1 to one of the input nodes of each of EX-OR gates 45.8 to 45.15.

EX-OR gates 45.0 to 45.15 output internal expected values IEX0 to IEX15, respectively. Determination circuits 46.0 to 46.15 determine whether or not data signals TQ0 to TQ15 are consistent in logic level to internal expected values IEX0 to IEX15, respectively. If data signals TQ0 to TQ15 are consistent in logic level to internal expected values IEX0 to IEX15, determination circuits 46.0 to 46.15 set signals JG0 to JG15 at "L" level indicating that a memory cell MC is normal, respectively. If not consistent, determination circuits 46.0 to 46.15 set signals JG0 to JG15 at "H" level indicating that memory cell MC is defective, respectively.

If output signals JG0 to JG7 of determination circuits 46.0 to 46.7 are all at "L" level, determination result degenerate circuit 47.0 sets signal Q0 at "H" level indicating that eight memory cells MC are normal. If at least one of signals JG0 to JG7 is at "H" level, determination result degenerate circuit 47.0 sets signal Q0 at "L" level indicating that at least one of eight memory cells MC is defective.

If output signals JG8 to JG15 of determination circuits 46.8 to 46.15 are all at "L" level, determination result degenerate circuit 47.1 sets signal Q1 at "H" level indicating that eight memory cells MC are normal. If at least one of signals JG8 to JG15 is at "H" level, determination result degenerate circuit 47.1 sets signal Q1 at "L" level indicating that at least one of eight memory cells MC is defective.

Data signals TQ0 to TQ15 of the data generation/determination circuit shown in FIG. 4 are inputted from memory core 11. Signals Q0 and Q1 are outputted to ATE 2 through selector 14. Further, external expected value EEX is inputted from ATE 2 through selector 14.

Figure 5:
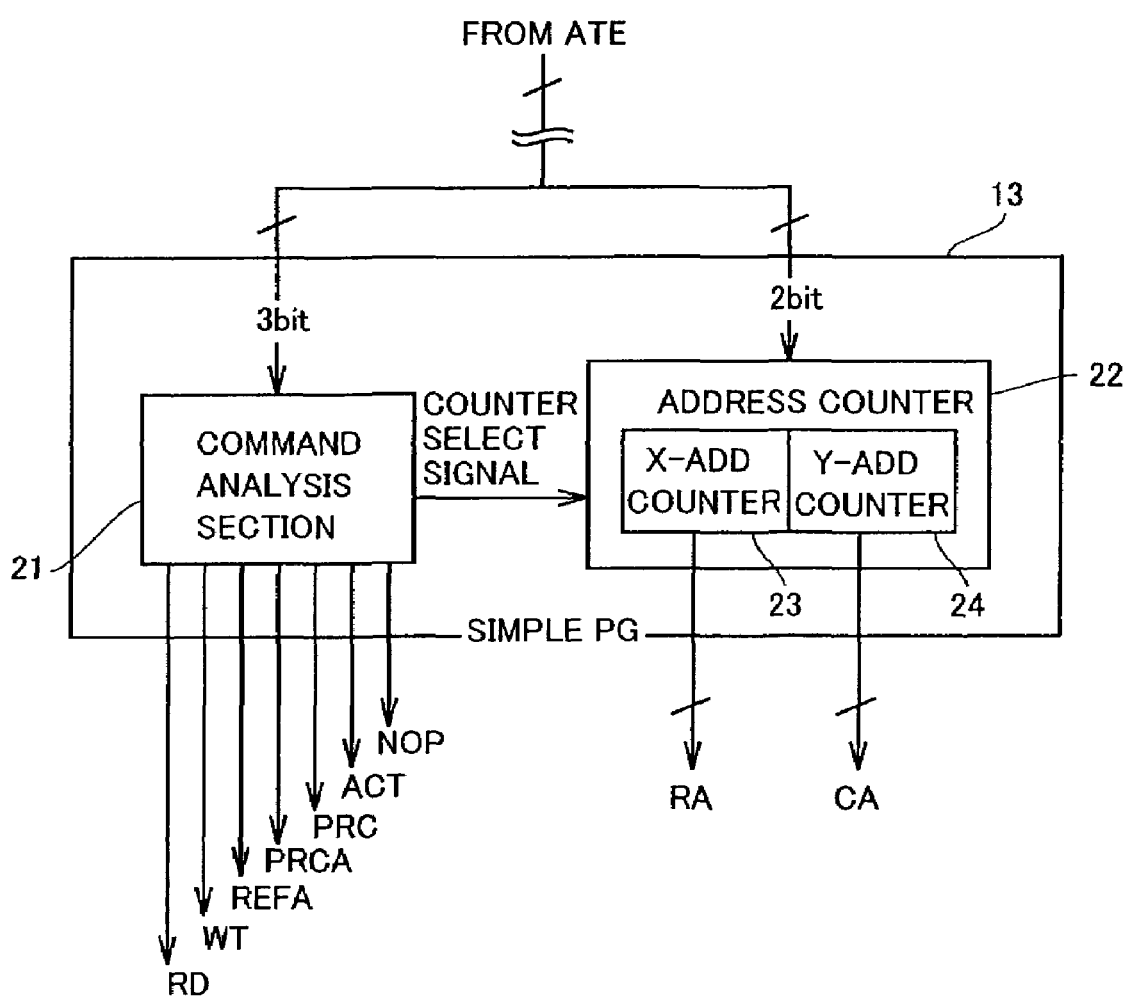
FIG. 5 is a block diagram showing a schematic configuration of a simple PG in a TIC 13.

FIG. 5 is a block diagram showing the schematic configuration of simple PG in TIC 13. This simple PG includes SDRAM (Synchronous Dynamic Random Access Memory)-like interface as well as a command analysis section 21 and an address counter 22. It is noted that the data generation/determination circuit described above operates synchronously with this simple PG and data is written/read to and from memory core 11 in accordance with a signal outputted from ATE 2.

Command analysis section 21 inputs a command of three bits from ATE 2, analyzes the command and outputs an analysis result to memory core 11 through selector 15. In addition, command analysis section 21 outputs a counter select signal to address counter 22 in accordance with the command analysis result.

Address counter 22 includes an X-ADD counter 23 which generates a row address RA and a Y-ADD counter 24 which generates a column address CA. Each of X-ADD counter 23 and Y-ADD counter 24 receives a counter control instruction of two bits outputted from ATE 2 through selector 14 and a counter select signal and controls a counter value.

FIGS. 6A and 6B are views for explaining the contents of commands and counter control instructions outputted from ATE 2. It is noted that the expression method of values in the present specification is according to the grammar of Verilog-HDL language widely used as a hardware description language.

If the command is 3'b000, command analysis section 21 interprets the command as "NOP", activates an NOP signal and outputs the NOP signal to memory core 11 through selector 15. Memory core 11 does not perform any special operation even when receiving this NOP command.

If the command is 3'b001, command analysis section 21 interprets the command as "ACT", activates an ACT signal and outputs the ACT signal to memory core 11 through selector 15. Memory core 11 starts an ACT operation when receiving this ACT command.

If the command is 3'b010, command analysis section 21 interprets the command as "PRC", activates a PRC signal and outputs the PRC signal to memory core 11 through selector 15. Memory core 11 starts a precharge operation when receiving this PRC command. This precharge operation is performed only to a designated bank memory.

If the command is 3'b011, command analysis section 21 interprets the command as "PRCA", activates a PRCA signal and outputs the PRCA signal to memory core 11 through selector 15. Memory core 11 starts a precharge operation when receiving this PRCA command. This precharge operation is performed to all bank memories.

If the command is 3'b100, command analysis section 21 interprets the command as "REFA", activates a REFA signal and outputs the a REFA signal to memory core 11 through selector 15. Memory core 11 starts an auto-refresh operation when receiving this a REFA command. In this auto-refresh operation, an address is generated by the counter in memory core 11 and a refreshed operation is performed.

If the command is "NOP", "ACT", "PRC", "PRCA" or "REFA", command analysis section 21 allows X-ADD counter 23 to be selected by the counter select signal.

If the command is 3'b101, command analysis section 21 interprets the command as "WT", activates a WT signal and outputs the WT signal to memory core 11 through selector 15. Memory core 11 starts a write operation when receiving this WT command.

If the command is 3'b110, command analysis section 21 interprets the command as "RD", activates an RD signal and outputs the RD signal to memory core 11 through selector 15. Memory core 11 starts a read operation when receiving this RD command.

If the command is "WT" or "RD", command analysis section 21 allows Y-ADD counter 24 to be selected by the counter select signal.

If the counter control instruction is 2'b00, address counter 22 interprets the counter control signal as an NOP instruction. At this time, address counter 22 controls X-ADD counter 23 and Y-ADD counter 24 to hold the values thereof as they are.

If the counter control instruction is 2'b01, address counter 22 interprets the counter control signal as an INC instruction. At this time, X-ADD counter 23 or Y-ADD counter 24 is selected in accordance with the counter select signal outputted from command analysis section 21 and the value of the selected counter is incremented by one.

If the counter control instruction is 2'b10, address counter 22 interprets the counter control signal as a DEC instruction. At this time, X-ADD counter 23 or Y-ADD counter 24 is selected in accordance with the counter select signal outputted from command analysis section 21 and the value of the selected counter is decremented by one.

Figures 7A, 7B:
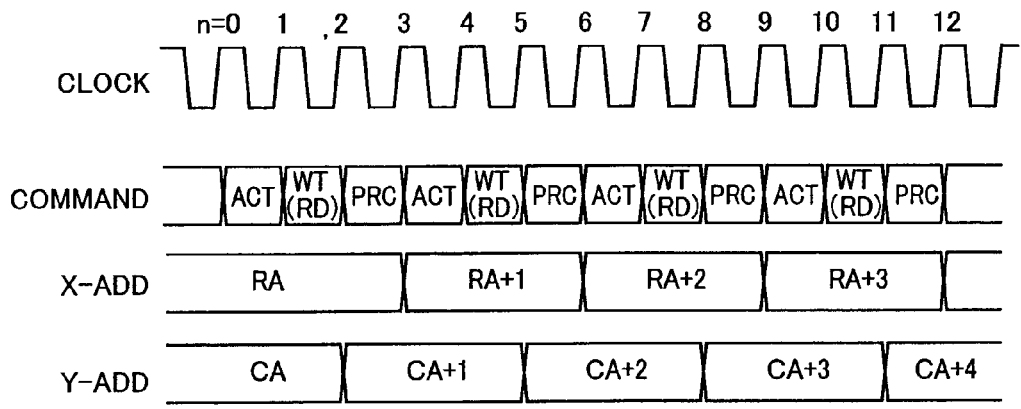
FIG. 7A is a timing chart for explaining an operation of simple PG.
FIG. 7B is a view which shows commands and counter control instructions corresponding to the timing chart shown in FIG. 7A.

FIG. 7A is a timing chart for explaining the operation of simple PG. FIG. 7B shows commands and counter control instructions corresponding to the timing chart of FIG. 7A.

In response to command "ACT" and counter control instruction "NOP" applied from ATE 2, command analysis section 21 activates the ACT signal and outputs the ACT signal to memory core 11 at clock n. Memory core 11 performs an operation according to the ACT command. In addition, X-ADD counter 23 is selected by the counter select signal outputted from command analysis section 21. However, since the control instruction is "NOP", the value of counter X-ADD 23 is held as it is.

In response to command "WT" and counter control instruction "INC" applied from ATE2, command analysis section 21 activates the WT signal and outputs the WT signal to memory core 11 at clock n+1. In addition, Y-ADD counter 24 is selected by the counter select signal outputted from command analysis section 21, the value of Y-ADD counter 24 is incremented according to command instruction "INC" and CA+1 is outputted as a column address.

In response to command "PRC" and counter control instruction "INC" applied from ATE 2, command analysis section 21 activates the PRC signal and outputs the PRC signal to memory core at clock n+2. Memory core 11 performs the precharge operation in accordance with PRC command. In addition, X-ADD counter 23 is selected by the counter select signal outputted from command analysis section 21, the value of X-ADD counter 23 is incremented according to control instruction "INC" and RA+1 is outputted as a row address.

Thereafter, similar operations are repeated and memory core 11 performs a write operation of one cycle within three clocks. In this embodiment, SDRAM is employed as one example of memory core 11. The other logic circuit loading memory may be employed as memory core 11. Further, in this embodiment, ATE 2 inputs external expected value EEX to TIC 13 through the external port of TIC 13. Alternatively, external expected value EEX may be inputted from the data input pin of TIC 13 since no write operation is performed during data read. In this case, it is possible to test memory core 11 by five bits for controlling simple PG (the command and the counter control instruction), one bit for outputting a determination result (the determination result is degenerated to one bit), one bit of a read determination expected value/write expected value data and one bit of the clock, i.e., a total of eight bits.

As described above, according to the test-facilitating circuit in the first embodiment, simple PG controls memory core 11 in accordance with the command of three bits and the counter control instruction of two bits outputted from ATE 2. It is, therefore, possible to decrease the number of pins used between ATE 2 and the semiconductor device having a mounted memory, to secure the number of times of measurement of the test and to test the semiconductor device having a mounted memory using an inexpensive tester.

Further, since the determination expected value is inputted through the external port of TIC 13 into memory core 11 from ATE 2, it is possible to decrease the frequency of determination errors compared with a case where the semiconductor device having a mounted memory is tested using one of read data as an internal expected value.

(Second Embodiment)

Figure 8:
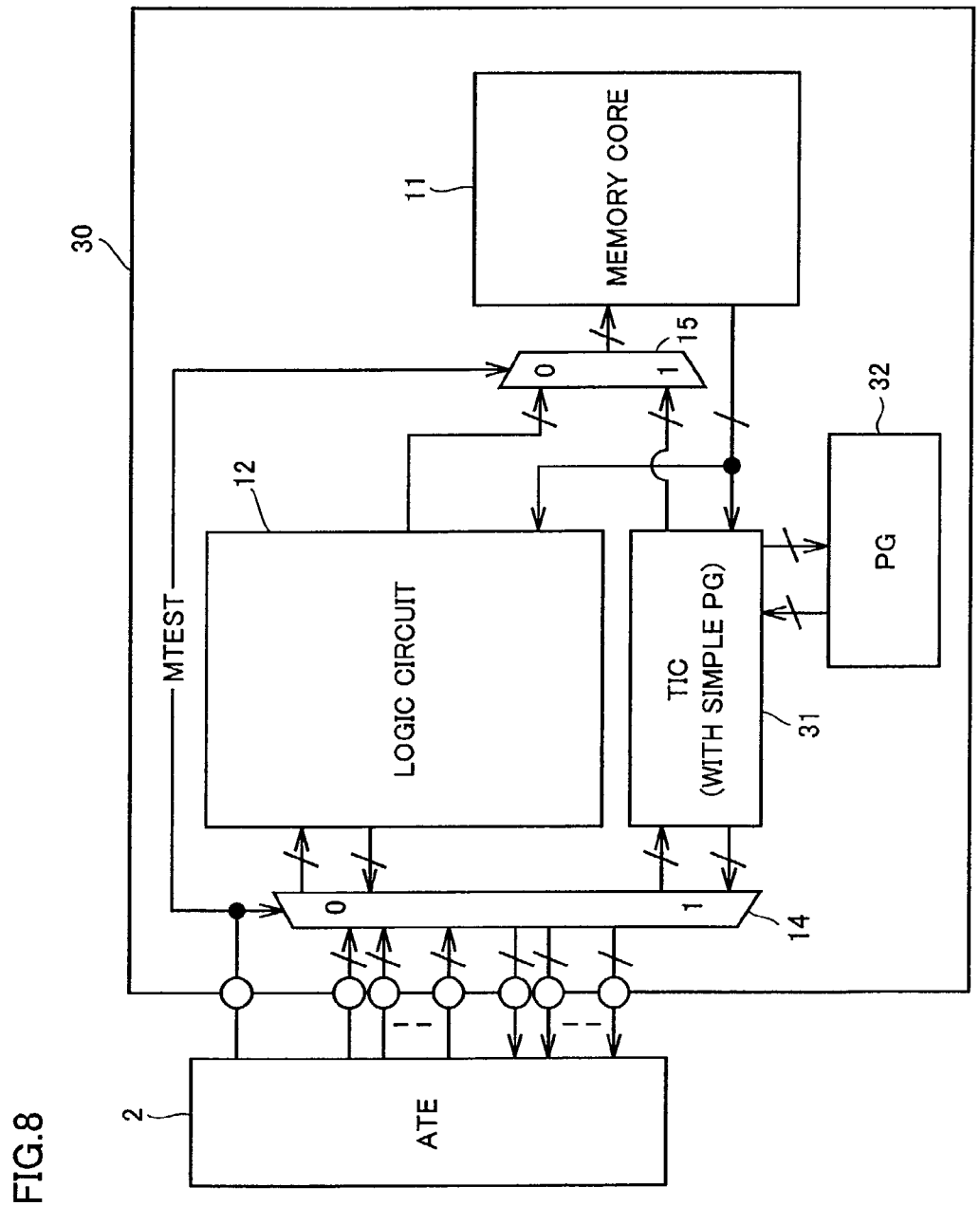
FIG. 8 is a block diagram showing a schematic configuration of a semiconductor device having a mounted memory on which a test-facilitating circuit according to a second embodiment of the present invention is mounted.

FIG. 8 is a block diagram showing the schematic configuration of a semiconductor device having a mounted memory on which a test-facilitating circuit according to the second embodiment according of the present invention is mounted. This semiconductor device having a mounted memory 30 includes memory core 11, logic circuit 12 which controls memory core 11, TIC 31 which includes simple PG, selector 14 which receives an output signal from ATE 2 and outputs the output signal to one of logic circuit 12 and TIC 31, and which receives output signals from logic circuit 12 and TIC 31, respectively and selectively outputs one of the output signals to ATE 2, selector 15 which receives output signals from logic circuit 12 and TIC 31, respectively and selectively outputs one of the output signals to memory core 11, and a PG 32. It is noted that constituent elements having the same functions as those in the first embodiment are denoted by the same reference symbols.

TIC 31 has not only the function described in the first embodiment but also a function to control the timing of memory core 11 and that of PG 32. The reason TIC 31 controls the timing of memory core 11 and that of PG 32 is that if the three functional blocks of TIC 31, memory core 11 and PG 32, for example, exchange signals among them, it is necessary for one of the functional blocks to take account of the exchange of signals between the other two functional blocks and timing control thereby becomes complicated.

TIC 31 also controls a clock used in TIC 31 and that supplied to PG 32. TIC 31 supplies a clock to PG 32 and stops supplying clocks to command analysis section 21 and address counter 22 in TIC 31 if memory core 11 is tested using PG 32. If memory core 11 is tested using only TIC 31, TIC 31 stops supplying the clock to PG 32.

PG 32 corresponds to an ALPG in a self test circuit built-in semiconductor memory disclosed in, for example, Japanese Patent Laying-Open No. 2001-148199 filed by the applicant of the present invention. ALPG in the self test circuit built-in semiconductor memory disclosed in Japanese Patent Laying-Open No. 2001-148199 will be briefly described.

Figure 9:
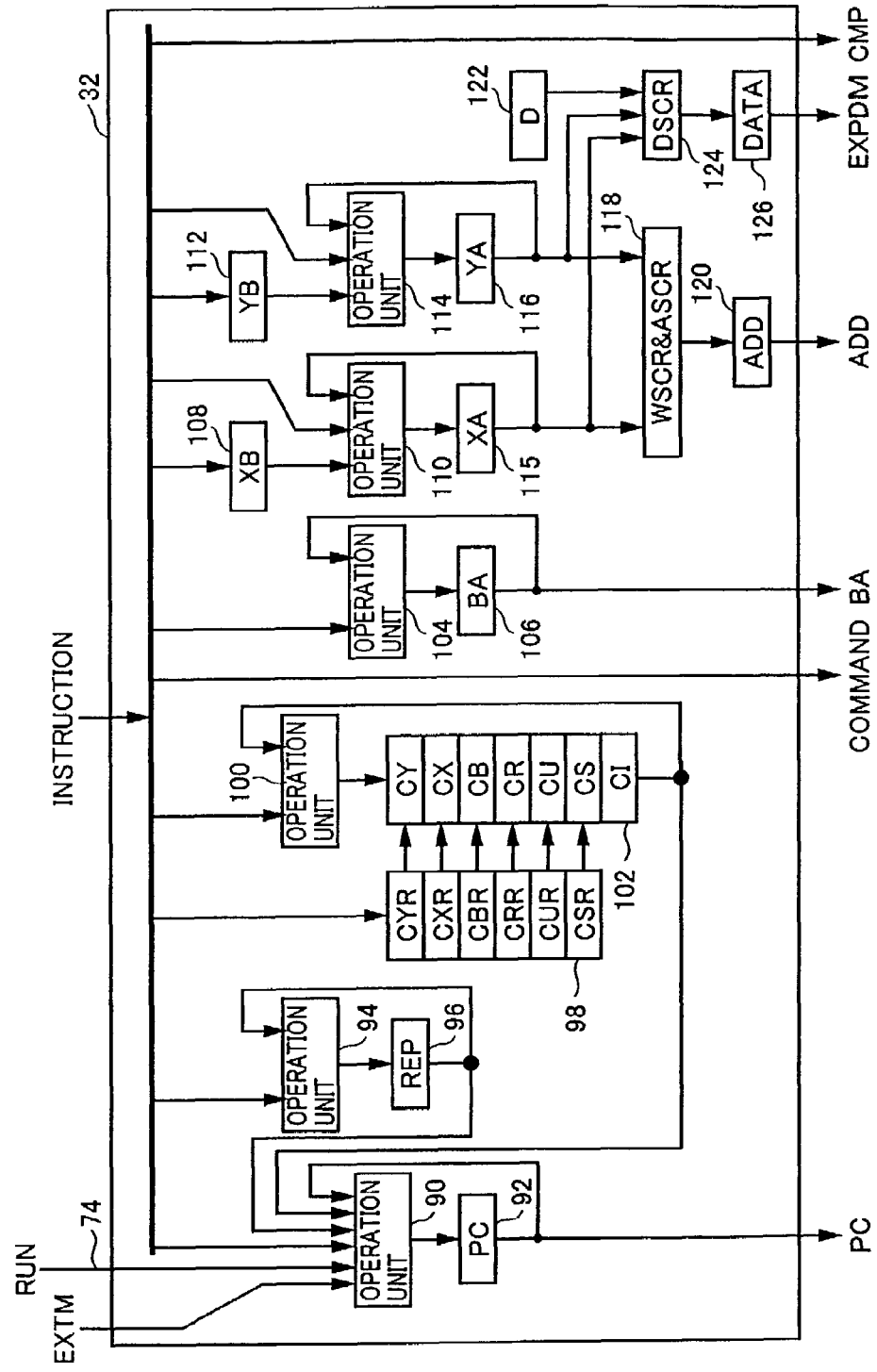
FIG. 9 is an explanatory view for the operation of an ALPG disclosed in Japanese Patent Laying-Open No. 2001-148199.

FIG. 9 is a view for explaining the operation of PG (ALPG) 32. PG 32 includes an operation unit 90 which calculates the address of an instruction to be executed next, a program counter 92 which stores the calculated address, a register 96 which stores a repeated number, an operation unit 100 which performs an operation when a conditional branch occurs, a general purpose register 102 which is used as a counter for repeating, and a reload register 98 which stores the initial value of general purpose register 102 when changing the initial value.

PG 32 also includes an operation unit 104 which calculates the bank address of memory core 11, a register 106 which stores the bank address, a register 108 which stores the first operand of an instruction, an operation unit 110 which calculates a logic address in an X direction in accordance with the content of the instruction and that of register 108, a register 115 which stores the logic address in the X direction, a register 112 which stores the second operand of the instruction, an operation unit 114 which calculates a logic address in a Y direction of a memory cell array 30 in accordance with the content of the instruction and that of register 112, a register 116 which stores the output of operation unit 114, an address scrambler 118 which scrambles the X direction address and the Y direction address outputted from registers 115 and 116, respectively, capable of a test taking account of the physical address in a mounted memory 30, an address register 120 which stores scrambled addresses, a register 122 which stores data which originates in expected value master data, a data scrambler 124 which performs an arithmetic operation between the content of register 122 and address signals applied from registers 115 and 116 in accordance with a test pattern and which generates test data, and a data register 126 which holds the output of data scrambler 124.

PG 32 further has a function to output a command (COMMAND) signal and a comparison (CMP) signal in accordance with the content of the instruction. Refer to Japanese Patent Laying-Open No. 2001-148199 for the detail of this PG (ALPG).

TIC 31 starts the operation of PG 32 by a RUN signal 74 if memory core 11 is tested using PG 32. An EXTM signal outputted from ATE 2 is inputted into PG 32 through selector 14. EXPDM signal and CMP signal are outputted to memory core 11 through TIC 31 and selector 15.

As described so far, according to the test-facilitating circuit in the second embodiment, PG 32 is connected to TIC 31 to allow TIC 31 to control the timing of PG 32. It is, therefore, possible to perform a further complicated test to memory core 11 using PG 32 which has an equivalent memory pattern generation function to that of advanced ATE in addition to the advantage described in the first embodiment.

Furthermore, since PG 32 generates a test pattern for memory core 11, it is possible to perform an AT SPEED TEST and to thereby further reduce test cost for the semiconductor device having a mounted memory.

(Third Embodiment)

Figure 10:
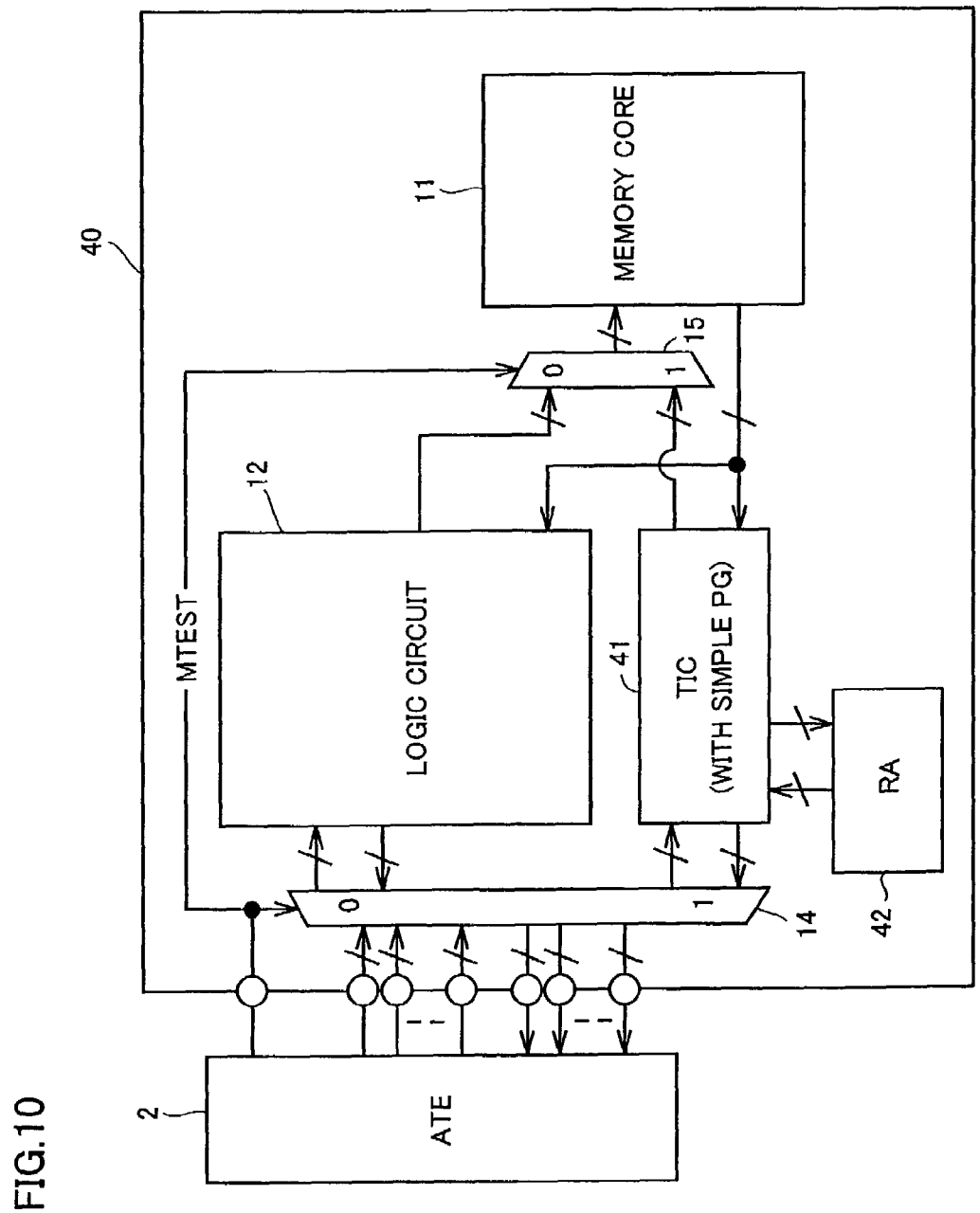
FIG. 10 is a block diagram showing a schematic configuration of a semiconductor device having a mounted memory on which a test-facilitating circuit according to a third embodiment of the present invention is mounted.

FIG. 10 is a block diagram showing the schematic configuration of a semiconductor device having a mounted memory on which a test-facilitating circuit according to the third embodiment of the present invention is mounted. This semiconductor device having a mounted memory 40 includes memory core 11, logic circuit 12 which controls memory core 11, a TIC 41 which includes simple PG, selector 14 which receives an output signal from ATE 2 and outputs the output signal to one of logic circuit 12 and TIC 41, and which receives output signals from logic circuit 12 and TIC 41, respectively and selectively outputs one of the output signals to ATE 2, selector 15 which receives output signals from logic circuit 12 and TIC 41, respectively and selectively outputs one of the output signals to memory core 11, and an RA (Repair Analyzer) 42. It is noted that constituent elements having the same functions as those in the first embodiment are denoted by the same reference symbols.

TIC 41 has not only the function described in the first embodiment but also a function to control the timing of memory core 11 and that of RA 42. The reason TIC 41 controls the timing of memory core 11 and that of RA 42 is that if the three functional blocks of TIC 41, memory core 11 and RA 42 exchange signals among them, it is necessary for one functional block to take account of the exchange of signals between the other two functional blocks and timing control thereby becomes complicated.

TIC 41 also controls a clock used in TIC 41 and that supplied to RA 42. If memory core 11 is tested using RA 42, TIC 41 supplies a clock to RA 42. If memory core 11 is tested only using TIC 41, TIC 41 stops supplying a clock to RA 42.

RA 42 corresponds to an address replacement determination unit in a semiconductor device disclosed in, for example, U.S. Pat. No. 6,243,307 filed by the applicant of the present invention. A BIST circuit with RA disclosed in U.S. Pat. No. 6,243,307 will be briefly described.

Figure 11:
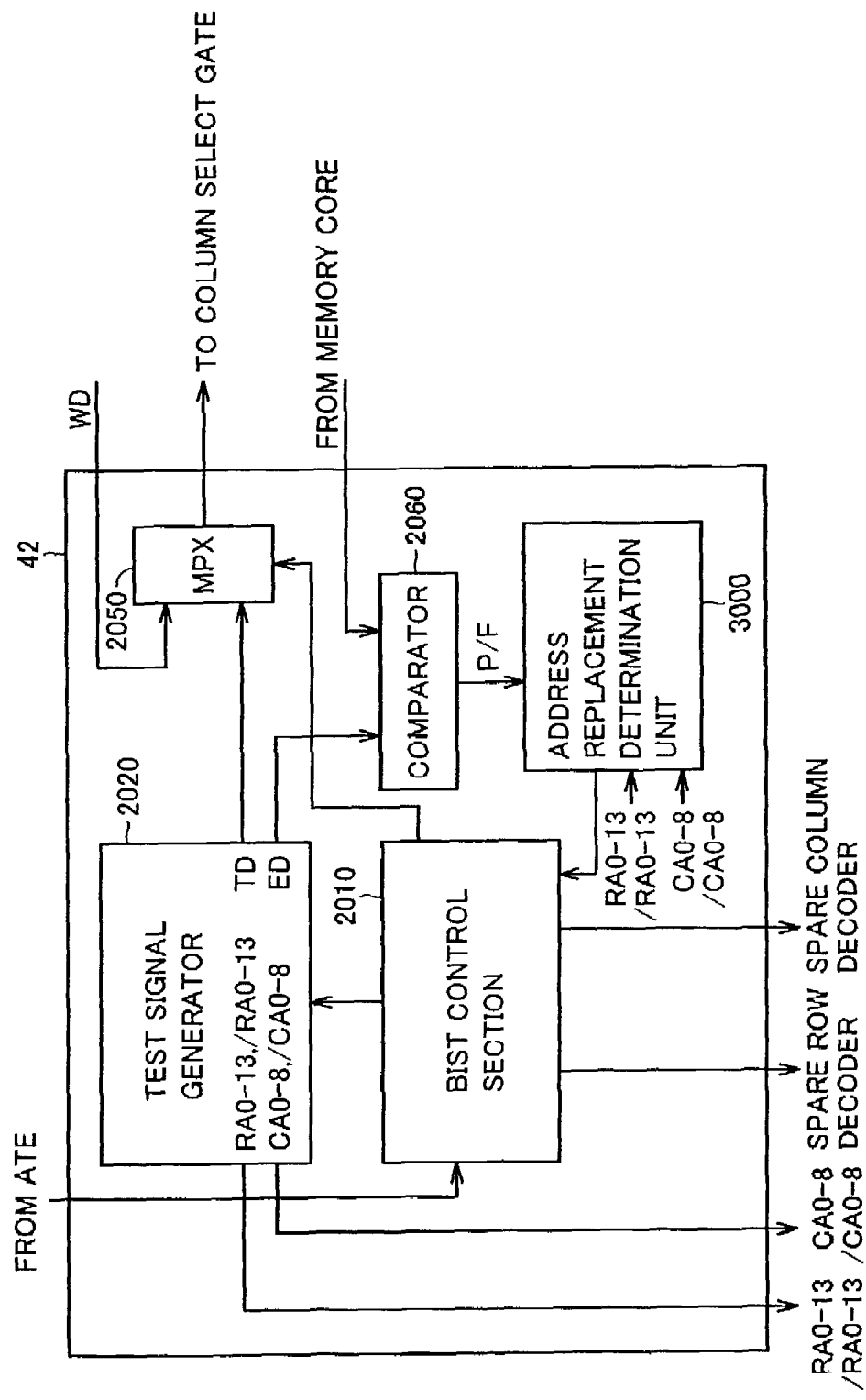
FIG. 11 is a block diagram showing a schematic configuration of a BIST circuit disclosed in U.S. Pat. No. 6,243,307.

FIG. 11 is a block diagram showing the schematic configuration of the BIST circuit with RA. The BIST circuit with RA includes a BIST control section 2010, a test signal generator 2020, a multiplexer 2050, a comparator 2060 and an address replacement determination unit 3000.

The BIST circuit with RA applies internal address signals generated by test signal generator 2020 to a row decoder, a spare row decoder, a column decoder and a spare column decoder of memory core 11, respectively. In addition, BIST circuit with RA applies test write data TD generated by test signal generator 2020 to a column select gate through multiplexer 2050, thereby writing test data to a memory cell array in memory core 11.

After a write operation during such a test operation is finished, test signal generation circuit 2020 generates an internal address signal again and sequentially reads written data. Address replacement determination unit 3000 sequentially detects the positions of defective memory cells in a normal memory cell array in accordance with a comparison result from comparator 2060 which compares this read data with expected value data ED, and determines the combination of a spare rows and a spare column to replace a plurality of defective row addresses and defective column addresses corresponding to these plural defective memory cells.

It is noted that refer to U.S. Pat. No. 6,243,307 for the detail of the BIST circuit with RA.

TIC 41 of the present invention corresponds to BIST control section 2010, test signal generation circuit 2020 and comparator 2060 of this BIST circuit with RA, and RA 42 corresponds to address replacement determination unit 3000.

As described so far, according to the test-facilitating circuit in the third embodiment, RA 42 is connected to TIC 41 to allow TIC 41 to control the timing of RA 42. It is, therefore, possible to perform a redundancy relief test to memory core 11 by an AT SPEED TEST and to reduce test cost required for the semiconductor device having a mounted memory in addition to the advantage described in the first embodiment.

(Fourth Embodiment)

Figure 12:
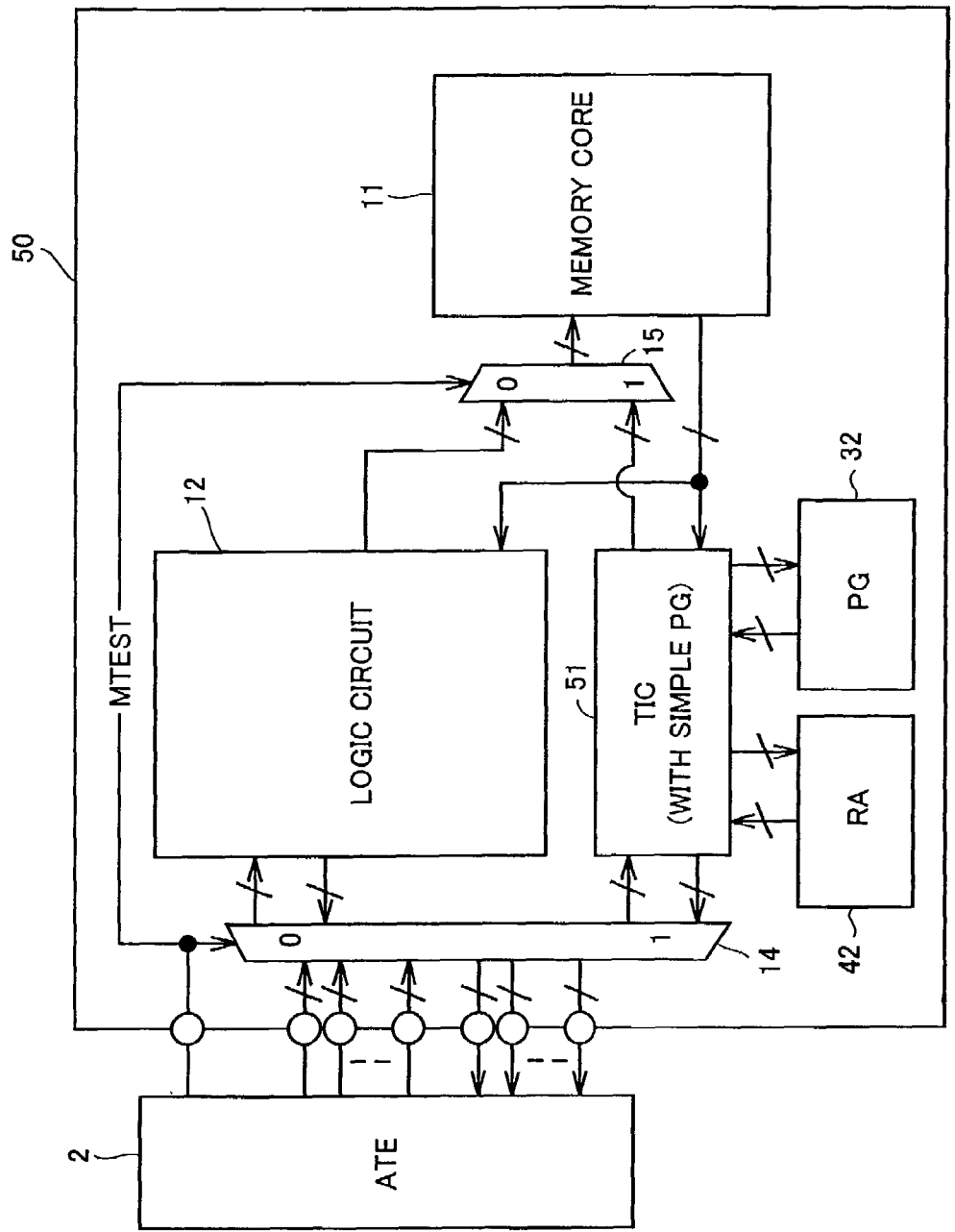
FIG. 12 is a block diagram showing a schematic configuration of a semiconductor device having a mounted memory on which a test-facilitating circuit according to a fourth embodiment in the present invention is mounted.

FIG. 12 is a block diagram showing the schematic configuration of a semiconductor device having a mounted memory on which a test-facilitating circuit according to the fourth embodiment according of the present invention is mounted. This semiconductor device having a mounted memory 50 includes memory core 11, logic circuit 12 which controls memory core 11, a TIC 51 which includes simple PG, selector 14 which receives an output signal from ATE 2 and outputs the output signal to one of logic circuit 12 and TIC 51, and which receives output signals from logic circuit 12 and TIC 51, respectively and selectively outputs one of the output signals to ATE 2, selector 15 which switches the output signal of logic circuit 12 to/from that of TIC circuit 51 and outputs the switched signal to memory core 11, PG 32, and RA 42. It is noted that constituent elements having the same functions as those in the first to third embodiments are denoted by the same reference symbols.

TIC 51 has not only the function described in the first embodiment but also a function to control the timing of memory core 11, that of PG 32 and that of RA 42. If memory core 11 is tested using PG 32, TIC 51 starts the operation of PG 32 using RUN signal 74. In this case, TIC 51 stops supplying clocks to command analysis section 21 and address counter 22 in TIC 51.

If memory core 11 is tested using TIC 51 and RA 42, TIC 51 stops supplying a clock to PG 32.

If memory core 11 is tested only by TIC 51, TIC 51 stops supplying clocks to PG 32 and RA 42 and stops the operations of PG 32 and RA 42.

As described so far, according to the test-facilitating circuit in the fourth embodiment, it is possible to obtain the effect described in the third embodiment in addition to the effect described in the second embodiment. It is also possible to reduce test cost required for the semiconductor device having a mounted memory.

Furthermore, it is possible to determine the configuration of the test circuit in accordance with the required specifications of the semiconductor device having a mounted memory and to thereby build in the test circuit so as to optimize test cost for each semiconductor device having a mounted memory.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device, comprising:
a memory core; and
a first test circuit testing said memory core, wherein said first test circuit includes:
a data generation circuit generating data written to said memory core;
a data determination circuit determining the data read from said memory core;
a command analysis section analyzing an externally applied command, outputting an analysis result to said memory core, and controlling an operation of said memory core; and
an address counter counting addresses and outputting the addresses to said memory core in accordance with an externally applied counter control instruction.

2. The semiconductor device according to claim 1, wherein
said address counter includes:
a first counter counting a row address; and
a second counter counting a column address, and
said command analysis section analyzes the externally applied command, selects one of said first counter and said second counter in accordance with an analysis result, and allows said selected counter to count the address in accordance with said counter control instruction.

3. The semiconductor device according to claim 1, wherein
said first test circuit supplies a determination expected value received from an external port to said data generation circuit to allow said data generation circuit to generate a test pattern for a test performed to said memory core.

4. The semiconductor device according to claim 1, wherein
said first test circuit outputs a determination result of said data determination circuit through the external port.

5. A semiconductor device, comprising:
a memory core; and
a first test circuit testing said memory core, wherein
said first test circuit includes:
a data generation circuit generating data written to said memory core;
a data determination circuit determining the data read from said memory core;
a command analysis section analyzing an externally applied command, outputting an analysis result to said memory core, and controlling an operation of said memory core;
an address counter counting addresses and outputting the addresses to said memory core in accordance with an externally applied counter control instruction; and
a second test circuit generating a test pattern for a test performed to said memory core; wherein
said first test circuit selectively executes a test of said memory core by said data generation circuit, said data determination circuit, said command analysis section and said address counter, and a test of said memory core by said second test circuit.

6. The semiconductor device according to claim 5, further comprising a third test circuit performing a redundancy relief test to said memory core, wherein
said first test circuit selectively executes the test of said memory core by said data generation circuit, said data determination circuit, said command analysis section and said address counter, the test of said memory core by said second test circuit, and a test of said memory core by said third test circuit.

7. The semiconductor device according to claim 6, wherein
said first test circuit controls clocks supplied to said data generation circuit, said data determination circuit, said command analysis section and said address counter, said second test circuit, and said third test circuit.

* * * * *

UNITED STATES PATENT AND TRADEMARK OFFICE
CERTIFICATE OF CORRECTION

| | | |
|---|---|---|
| PATENT NO. | : 7,032,141 B2 | Page 1 of 1 |
| APPLICATION NO. | : 10/198106 | |
| DATED | : April 18, 2006 | |
| INVENTOR(S) | : Tetsushi Tanizaki | |

It is certified that error appears in the above-identified patent and that said Letters Patent is hereby corrected as shown below:

TITLE PAGE,

Item "57) ABSTRACT", line 3, change "consist of" to -- comprises --.

Signed and Sealed this

Nineteenth Day of December, 2006

JON W. DUDAS
*Director of the United States Patent and Trademark Office*